United States Patent
Surdeanu et al.

(10) Patent No.: US 8,174,041 B2
(45) Date of Patent: May 8, 2012

(54) LIGHTING UNIT WITH TEMPERATURE COMPENSATION

(75) Inventors: Radu Surdeanu, Roosbeek (BE); Viet Nguyen Hoang, Leuven (BE); Benoit Bataillou, Brussels (BE)

(73) Assignee: NXP B.V., Eindhoven (NL)

( * ) Notice: Subject to any disclaimer, the term of this patent is extended or adjusted under 35 U.S.C. 154(b) by 71 days.

(21) Appl. No.: 12/864,752

(22) PCT Filed: Jan. 27, 2009

(86) PCT No.: PCT/IB2009/050333
§ 371 (c)(1),
(2), (4) Date: Sep. 3, 2010

(87) PCT Pub. No.: WO2009/095860
PCT Pub. Date: Aug. 6, 2009

(65) Prior Publication Data
US 2011/0006328 A1    Jan. 13, 2011

(30) Foreign Application Priority Data
Jan. 29, 2008    (EP) .................................... 08101048

(51) Int. Cl.
*H01L 33/48* (2010.01)
*H01L 33/00* (2010.01)

(52) U.S. Cl. ........... 257/98; 257/E33.056; 257/E33.001; 438/27

(58) Field of Classification Search ............... 257/98, 257/E33.056, E33.001; 438/27
See application file for complete search history.

(56) References Cited

U.S. PATENT DOCUMENTS

| | | | |
|---|---|---|---|
| 3,699,407 A | 10/1972 | Gurtler et al. | |
| 4,040,078 A * | 8/1977 | Eckton et al. | 250/551 |
| 4,857,746 A | 8/1989 | Kuhlmann et al. | |
| 5,448,077 A | 9/1995 | Krause | |
| 2004/0222357 A1 | 11/2004 | King et al. | |
| 2005/0129079 A1 | 6/2005 | Iwai | |
| 2005/0180698 A1 | 8/2005 | Hauffe et al. | |
| 2006/0071229 A1 | 4/2006 | Guenter | |
| 2006/0192084 A1 | 8/2006 | Lee et al. | |

OTHER PUBLICATIONS

International Search Report and Written Opinion for Application PCT/IB2009/050333 (Jan. 27, 2009).

* cited by examiner

*Primary Examiner* — Benjamin Sandvik
*Assistant Examiner* — Whitney T Moore

(57) ABSTRACT

A lighting unit comprises a packaging substrate (10) formed from a semiconductor, a channel (12) formed in the substrate and a discrete light emitting diode arrangement (34) in the channel. A surface region of the channel comprises doped semiconductor layers (20, 24) which define a light sensor. The arrangement provides a light sensor (which can be used to determine colour and/or output flux) for a LED unit, with the light sensor embedded in substrate used for packaging. This provides a low cost integration process and provides good registration between the light sensor and the LED output.

17 Claims, 1 Drawing Sheet

LIGHTING UNIT WITH TEMPERATURE COMPENSATION

Figure 1:
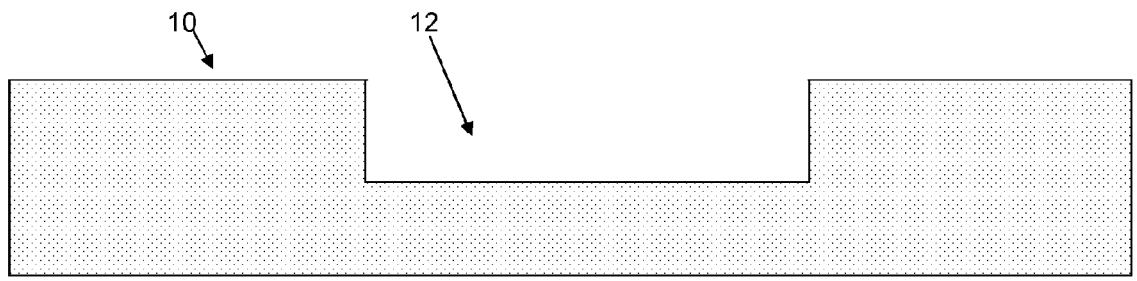

This invention relates to lighting devices using light emitting diodes (LEDs), and particularly to the control of such devices to compensate for temperature-dependent characteristics of the device output.

Lighting using solid-state devices such as LEDs is gaining momentum. The use of LEDs for lighting has several advantages over the use of conventional light sources, including a better light output/dimension ratio and improved power efficiency. The light output intensity of a LED can be controlled by either:

(a) regulating the amplitude of the current through the LED, or (b) regulating the frequency and duty cycle of the current pulse through the LED.

A combination of both techniques can also be used.

During operation, the LED temperature increases and this influences the amount of light output of the LED as well as the dominant wavelength of the output light.

It has been recognised that either temperature measurement or optical analysis of the light output is desirable to provide feedback value for use in controlling the LED driver conditions. This feedback can compensate both for temperature dependent effects and for ageing of the LED.

For temperature compensation, the LED temperature can be measured using an external temperature sensor located close to the LED. This method has one major disadvantage that the measured temperature is not the real temperature at the LED junction (which is usually higher).

The alternative approach is to measure the light output flux and colour temperature, and use these measurements to provide a compensation drive scheme. This can compensate both for temperature effects and ageing. To provide good performance in all ranges of temperature and usage time span, a flux and colour sensor needs to be closely coupled to the LED unit. Ideally, the position of this sensor should be as close as possible to the LED.

There is therefore a need for a device in which a light sensor is integrated into the structure of an LED package to provide good quality feedback information, to enable suitable compensation to be carried out.

According to the invention, there is provided a lighting unit comprising:

a packaging substrate formed from a semiconductor;

a channel formed in the substrate;

a discrete light emitting diode arrangement in the channel; and a light sensor, wherein a surface region of the channel comprises doped semiconductor layers which define the light sensor.

The arrangement provides a light sensor (which can be used to determine colour and/or output flux) for a LED unit, with the light sensor embedded in a semiconductor (such as silicon) substrate used for packaging. This provides a low cost integration process and provides good registration between the light sensor and the LED output.

A surface region of the channel preferably comprises a first buried layer doped with a first polarity, and a second layer nearer the surface and doped with an opposite second polarity. Thus, a p-n or p-i-n junction can be defined at the channel surface region, and this can form part of a sensor structure. For example, the light sensor can comprise a PIN diode.

In this case, the surface region of the channel can comprise a first, n-doped buried layer, an intrinsic layer nearer the surface, and a second, p-doped layer nearer the surface. The surface region of the channel can further comprise a top oxide layer at the channel surface.

The channel preferably comprises a base and a side wall or side walls. The base and the side wall or side walls of the channel can each define part of the structure of the light sensor, so that the light sensor structure partially surrounds or encases the LED. In this way, as much of the light which is not directed to the intended output can be used as part of the light sensor function.

Metal contacts can be provided between the discrete light emitting diode arrangement and the surface of the channel.

The invention also provides a method of manufacturing a lighting unit, comprising:

defining a channel in a semiconductor packaging substrate;

processing a surface region of the channel to define doped semiconductor layers which form a light sensor; and mounting a discrete light emitting diode arrangement in the channel.

This provides a low cost method for integrating a light sensor into the package of a discrete LED device.

Figure 2:
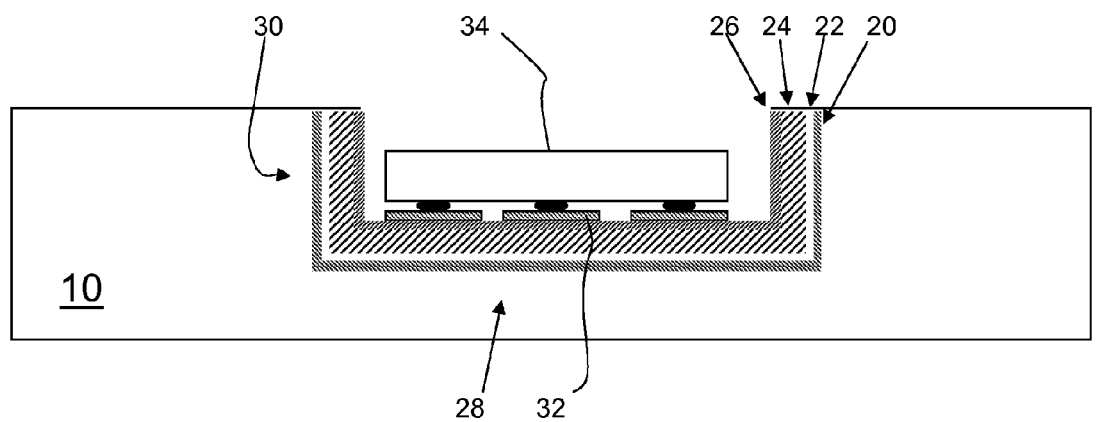

An example of the invention will now be described with reference to the accompanying drawings, in which:

FIG. 1 shows a substrate used to package a discrete LED in a device of the invention; and FIG. 2 shows the lighting system of the invention.

The invention provides a lighting unit in which an LED is mounted in a channel formed in a substrate, with a surface region of the channel defining a light sensor for use in feedback control of the LED.

FIG. 1 shows a substrate 10 used to package a discrete LED. The substrate is formed from a Si wafer.

A Shallow Trench Isolation (STI) module is used to create a shallow trench channel 12 in the Si substrate as shown in FIG. 1, to house the LED. The size of the channel can be easily modified to the desired dimensions. The channel can be a straight trench across the substrate (and have only opposing side walls) or it may be a closed shape, for example a quadrilateral or circle in plan view (and have a surrounding side wall or walls).

The surface region of the channel 12 is processed to define the layers to form a PIN diode, which can be used as a colour sensor. The use of a PIN diode as a colour sensor is well known. Incident light induces carriers into the depletion region of the junction. These photo-carriers are then absorbed into the silicon.

As shown in FIG. 2, the PIN diode structure comprises a first, n-doped buried layer 20, an intrinsic layer 22 nearer the surface, and a second, p-doped layer 24 nearer the surface. The surface region of the channel also comprises a top oxide layer 26 at the channel surface.

The channel has a base 28 and a side wall or side walls 30. The base and the side wall or side walls of the channel each define part of the structure of the light sensor, so that the light sensor structure partially surrounds or encases the LED.

Thus, a PIN diode is formed on the base and the sides of the channel. The formation of the buried layers can for example use a Vapour Phase Doping (VPD) step, which for p+ doping uses a $B_2H_6$ flow.

The Boron dopant concentrations obtained depend on the flow, temperature and time at which the process is carried out. For example, at a flow of 50 ml/min, at 800 degrees Celsius, after 30 minutes a Boron surface concentration of 4e20 at./$cm^3$ is obtained. This is already higher than the maximum Boron solid solubility in Silicon.

The n+ doping can be carried out using plasma doping (PLAD), which is a well established flexible technique for conformal doping.

The n+ doping can be carried out by normal implantation before the cavity is formed in the silicon. The silicon etching in this case is adjusted to take into account the fact that the silicon to be removed has an incorporated n+ dopant.

Plasma Doping (PLAD) can also be used for the p+ doping.

In all cases, the obtained junction can be positioned such that the colour sensor has the optimal quantum efficiency for the desired wavelengths.

For the three wavelengths needed (Red, Green and Blue), three different depths for the junctions can be employed, e.g. for red 3 μm, for green 800 nm and for blue 200 nm.

This junction depth can be controlled by varying the thickness of the p-doped layer 24, for example by using different implant doses, and/or by using a different thermal budget at the drive-in/anneal step (a higher thermal budget for a deeper layer). The light absorption of silicon is at different depths for different wavelengths, and by positioning the p-n junction, the structure can be tuned to be sensitive to different wavelengths.

After the processing of the surface region of the channel, metal connections 32 are made for the LED 34, to enable external contact to the LED anode and cathode, and this is carried out in the same way as for a standard packaging process.

The contact to the N and P contacts of the PIN diode arrangement can be made at the surface of the substrate 10 in conventional manner, and these contacts are not shown. As the silicon substrate 10 is not used to form circuitry for the LED, but instead only forms a protective packaging for the LED chip, no connections between the LED and the PIN diode are required.

The detected light output can be used to compensate for ageing and temperature dependence of the light output. By measuring the light output for known drive conditions, the light output characteristics can be determined, and used to alter the drive scheme so that a desired output intensity and/or colour can be more accurately achieved. The use of an optical sensor feedback signal to control the drive of an LED is well known, and will not be described in further detail.

Compensation schemes generally used include flux feed-back, temperature feed-back (using a discrete temperature sensor), or a combination of the these, and colour point feed-back.

In the example above, the substrate 10 is essentially a protective packaging, and is not used to integrate other circuit elements. Thus, in one example, the only device integrated into the substrate 10 is the PIN diode. However, the substrate may be used to form other integrated devices, and this possibility is not excluded from the scope of this invention.

The substrate is typically silicon, but other semiconductors can also be used.

The invention provides a highly integrated colour sensor and LED unit, which can lead to a wealth of applications, such as LCD backlighting, colour sequential backlighting, 2D dimming in LCD displays, etc. The use of sidewall integration of the sensors enables minimal flux loss to give good light collection efficiency of the sensor. There is a considerable size reduction of the lighting system, with at least the sensor part of the control circuit integrated into the LED package.

The PIN diode is formed in a "surface region" of the substrate. By this is meant that there are layers at or beneath the surface which define the sensor structure. It will be apparent from the description above that some of the required processing to form the light sensor can be carried out before the channel etching, with other steps carried out afterwards. These possibilities are all intended to be within the scope of the invention as claimed.

The nature of the LED chip has not been described in detail. This can be any type of conventional LED device, particularly as the integrated light sensor does not share any fabrication steps with the LED, or need to be electrically connected to the LED. Thus, the LED and light sensor are entirely separate devices in terms of their manufacture, and any LED can be mounted in the channel.

Various other modifications will be apparent to those skilled in the art.

The invention claimed is:

1. A lighting unit comprising:
   a packaging substrate formed from a semiconductor;
   a channel formed in the substrate, the channel being formed by a base and a side wall or side walls;
   a discrete light emitting diode arrangement mounted in the channel; and
   a light sensor,
   wherein a surface region of the base and the side wall or side walls comprises doped semiconductor layers which define the light sensor.

2. A lighting unit as claimed in claim 1, wherein the surface region of the base and the side wall or side walls comprises a first buried layer doped with a first polarity, and a second layer nearer the surface and doped with an opposite second polarity.

3. A lighting unit as claimed in claim 1, wherein the light sensor comprises a PIN diode.

4. A lighting unit as claimed in claim 3, wherein the surface region of the base and the side wall or side walls comprises a first, n-doped buried layer, an intrinsic layer nearer the surface, and a second, p-doped layer nearer the surface.

5. A lighting unit as claimed in claim 4, wherein the surface region of the base and the side wall or side walls further comprises a top oxide layer at the channel surface.

6. A lighting unit as claimed in claim 1, wherein metal contacts are provided between the discrete light emitting diode arrangement and the surface of the channel.

7. A lighting unit as claimed in claim 1, wherein the light sensor comprises a PIN diode.

8. A lighting unit as claimed in claim 1, wherein the light sensor comprises p-n junctions at three different depths in the surface region for sensing red, green, and blue light.

9. A lighting unit as claimed in claim 1, wherein the light sensor comprises p-n junctions at different depths in the surface region for sensing light at different wavelengths.

10. A method of manufacturing a lighting unit, comprising:
    defining a channel in a semiconductor packaging substrate, the channel being defined by a base and a side wall or side walls;
    processing a surface region of the base and the side wall or side walls to define doped semiconductor layers which form a light sensor; and
    mounting a discrete light emitting diode arrangement in the channel.

11. A method as claimed in claim 10, wherein defining the channel comprises applying a shallow trench isolation method.

12. A method as claimed in claim 10, wherein the surface region of the base and the side wall or side walls is processed to define a first buried layer doped with a first polarity, and a second layer nearer the surface and doped with an opposite second polarity.

13. A method as claimed in claim 10, wherein the surface region of the base and the side wall or side walls is processed to define a first, n-doped buried layer, an intrinsic layer nearer the surface, and a second, p-doped layer nearer the surface, thereby defining a PIN diode light sensor.

14. A method as claimed in claim 13, further comprising defining a top oxide layer at the channel surface.

15. A method as claimed in claim 10, further comprising providing metal contacts between the discrete light emitting diode arrangement and the surface of the channel.

16. A method as claimed in claim 10, wherein the light sensor comprises p-n junctions at three different depths in the surface region for sensing red, green, and blue light.

17. A method as claimed in claim 10, wherein the light sensor comprises p-n junctions at different depths in the surface region for sensing light at different wavelengths.

* * * * *